（12） United States Patent
McAlvay et al.

(10) Patent No.: US 10,481,585 B2
(45) Date of Patent: *Nov. 19, 2019

(54) PRINTED CIRCUIT BOARD DESIGN AND MANUFACTURING

(71) Applicant: Tempo Automation, Inc., San Francisco, CA (US)

(72) Inventors: Jeffrey McAlvay, San Francisco, CA (US); Shannon Lincoln, San Francisco, CA (US); Jesse Koenig, San Francisco, CA (US); Thomas Anderson, Rohnert Park, CA (US); Jonas Neubert, San Francisco, CA (US); Shashank Samala, San Francisco, CA (US); Ryan Saul, Berkeley, CA (US)

(73) Assignee: Tempo Automation, Inc., San Francisco, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 15/863,721

(22) Filed: Jan. 5, 2018

(65) Prior Publication Data

US 2018/0275633 A1    Sep. 27, 2018

Related U.S. Application Data

(63) Continuation of application No. 15/465,460, filed on Mar. 21, 2017, now Pat. No. 9,971,338.

(51) Int. Cl.
*G05B 19/4097* (2006.01)
*H05K 3/00* (2006.01)

(52) U.S. Cl.
CPC ....... *G05B 19/4097* (2013.01); *H05K 3/0005* (2013.01); *G05B 2219/45031* (2013.01); *Y02P 90/265* (2015.11)

(58) Field of Classification Search
CPC ...... G05B 19/4097; G05B 2219/45031; H05K 3/00; Y02P 90/265
See application file for complete search history.

(56) References Cited

U.S. PATENT DOCUMENTS

| 7,281,232 B1 * | 10/2007 | Nicolino, Jr. ....... G06F 17/5081 716/112 |
| 8,055,714 B2 | 11/2011 | Chiu-Chien |
| 2002/0087440 A1 | 7/2002 | Blair |
| 2004/0199891 A1 | 10/2004 | Bentley |
| 2011/0047140 A1 | 2/2011 | Free |
| 2013/0024400 A1 * | 1/2013 | DeCusatis ........... G06F 17/5068 705/400 |
| 2014/0114617 A1 | 4/2014 | Newhard |

OTHER PUBLICATIONS

Lee "Automating the DFX process: leveraging today's technology tools" from "Elektron Mar. 2006" (Year: 2006).*

* cited by examiner

Primary Examiner — Yuhui R Pan
(74) Attorney, Agent, or Firm — Van Pelt, Yi & James LLP

(57) ABSTRACT

A spatial model of a printed circuit board assembly is generated based on an input file. The spatial model is used to determine a spatial feature not directly specified in the input file. A manufacturing parameter is determined based at least in part on the determined spatial feature. A proposal to manufacture the printed circuit board assembly is generated programmatically based at least in part on the determined manufacturing parameter.

17 Claims, 7 Drawing Sheets

PRINTED CIRCUIT BOARD DESIGN AND MANUFACTURING

CROSS REFERENCE TO OTHER APPLICATIONS

This application is a continuation of co-pending U.S. patent application Ser. No. 15/465,460 entitled PRINTED CIRCUIT BOARD DESIGN AND MANUFACTURING filed Mar. 21, 2017 which is incorporated herein by reference for all purposes.

BACKGROUND OF THE INVENTION

Manufacturing a printed circuit board assembly can be a time-consuming process. A design is created, a bare Printed Circuit Board (PCB) is fabricated, and components are soldered onto the bare PCB, to create a Printed Circuit Board Assembly (PCBA). A PCB refers to a bare PCBA substrate, without any other parts attached to it by soldering or other attachment process. A PCBA refers to a PCB with attached components. A PCBA design can comprise one to thousands of electrical components and one to thousands of electrical traces. A PCBA designer typically will provide a PCBA manufacturer with manufacturing data files, but the manufacturer often is unable to provide an accurate estimate of the amount of time and cost needed to manufacture a batch of PCBAs based on the manufacturing data files alone. For example, typically the manufacturing data files are not optimized or suitable for the manufacturer's fabrication and assembly process, and do not provide the manufacturer with sufficient information to make the PCBA. Instead the manufacturer typically must study the design, run interactive software to analyze the design, and ask the PCBA designer clarifying questions to fully understand the design and the time and cost that will be required to manufacture it. The manufacturer can make assumptions about how the printed circuit board is supposed to be manufactured, but such assumptions can lead to manufacturing errors or holdups, which will increase the amount of time needed to manufacture the PCBA. The manufacturer and the PCBA designer can have a series of communications to clear up any confusion. However, such communications delay the manufacturing process. These manufacturing errors and delays prevent manufacturers from accurately estimating the amount of time and cost needed to manufacture a batch of PCBAs.

BRIEF DESCRIPTION OF THE DRAWINGS

Various embodiments of the invention are disclosed in the following detailed description and the accompanying drawings.

DETAILED DESCRIPTION

Figure 1:
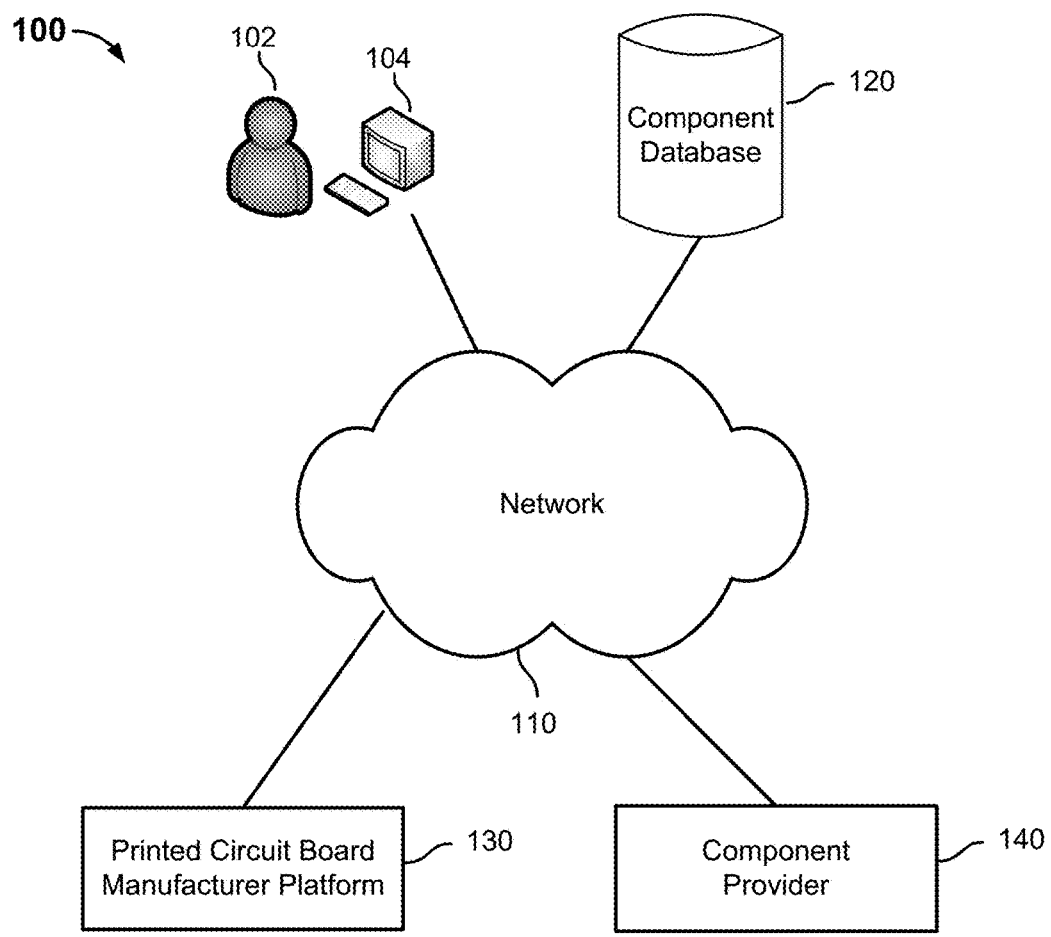
FIG. 1 is a block diagram illustrating a system for manufacturing a PCBA according to some embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A technique to reduce the amount of time to manufacture a PCB and PCBA and to provide an accurate quote of the cost and/or amount of time to manufacture the PCB and PCBA is disclosed. A design file is received from a PCBA customer. The design file includes a set of Logical Layers (e.g. conductive layer, silk screen layer, component layer, etc.) that describe the desired properties of the PCBA (e.g. conductor shape and placement, artwork shape and placement, components location and rotation, layer thicknesses, etc.). However, the design file does not provide a data representation that explicitly states all information required for a PCBA manufacturer to rapidly manufacture a PCBA or to rapidly provide a quote of a cost and/or time to manufacture the PCBA. For example, the layer information does not include design information that directly influences the cost and/or time to manufacture the PCBA (e.g., minimum component spacing, minimum trace spacing, minimum hole size, etc.). PCBA designs can be complex with up to thousands of components, traces, and holes in the PCBA design. Manually or semi-automatically determining the information needed to quote a cost and delivery time can take hours, even days, which adds to the amount of time to manufacture the PCBA.

Certain features of a PCBA design can increase the amount of time needed to manufacture the PCB. For example, a PCB design with a via in a pad can take longer to manufacture than a PCB design without a via in pad. A PCB design with a smaller minimum trace width (e.g., 0.0025 inches) can take longer to manufacture than a PCB design with a larger trace width (e.g., 0.006 inches). The longer time is due to increased sensitivity of the manufacturing process to errors in creating smaller design features. Manufacturing smaller design features requires increased etching time and acceptance of decreased manufacturing yield. An error in creating small design features can result in delays because the PCB needs to be re-manufactured. Without knowing specific design information that directly influences the cost and/or time to manufacture the PCB, a manufacturer is unable to accurately estimate the cost and/or time to manufacture the PCBA.

In some embodiments, to determine design information needed to accurately estimate a cost and/or time to manufacture a PCBA, a PCBA design file (e.g., CAD file) is converted to a standard format and geometry data is extracted from the converted file. A spatial model of a PCBA is generated based on the geometry data. In other embodiments, a spatial model of a PCB is generated from the design file. The spatial model is configured to determine one or more spatial features that influence the cost and/or amount of time needed to manufacture the PCBA. Given the complexity of a PCBA design, manually determining such spatial features can be a time-consuming process. Determining such features via the spatial model reduces the total manufacturing time and enables the PCBA manufacturer to accurately provide a quote of a cost and/or amount of time needed to manufacture the PCBA. The spatial model enables a quote to be provided within seconds or minutes of receiving design information. Prior to using the spatial model, it could take hours, even days to provide a quote of the cost and/or amount of time needed to manufacture the PCBA.

A quote of a cost and/or amount of time needed to manufacture the PCBA is based on a combination of the spatial features. Depending on the values of each of the determined spatial features, the quote is adjusted accordingly. One or more suggestions can be provided to modify the PCBA design to reduce the cost and/or amount of time needed to manufacture the PCBA.

FIG. 1 is a block diagram illustrating a system for manufacturing a PCBA according to some embodiments.

In the example shown, the system 100 includes a client device 104 connected via network 110 to a component database 120, PCBA manufacturer platform 130, and one or more component providers 140.

Client device 104 is accessible to a user 102. Client device 104 can be configured to transmit an input file. For example, an input file can be a design file (e.g., CAD file), a manufacturing data file, a bill of materials (BOM) file, and/or other information associated with designing a PCBA.

A design file can include a digital representation of some or all desired properties of a PCBA (e.g. conductor shape and placement, artwork shape and placement, components location and rotation, layer thicknesses, etc.). A design file may include a set of Logical Layers (e.g. conductive layer, silk screen layer, component layer, etc.) that describe the desired properties of the PCBA. A design file can include a representation of each of the physical layers, logical layers, and conductive layers of the PCBA design.

The physical layer can refer to the physical results of a manufacturing process, described as materials or the result of operations on a PCB or PCBA. Operations can include the addition of raw materials, such as a layer of FR-4 fiberglass. Operations can also include additive processes such as plating, silk screening, soldering, or component placement. Operations can also include subtractive processes, such as etching, drilling, and routing. CAD tools often specify or describe physical layers as combinations of one or more logical layers.

A logical layer can refer to a specification of PCBA geometries or properties used to support the manufacturing process or PCBA documentation. This can include component placement coordinates, component side, geometry of a physical layer as a collection of polygons, keepout areas, special assembly instructions, part property values, or any other data that can be assigned a layer name and that often, but not always, has two-dimensional coordinates.

A conductive layer can refer to a physical layer that is made of a conductive material including but not limited to copper, nickel, gold, silver, aluminum, and tungsten.

A design file can also include enumerations of properties in list or tabular format (e.g. physical layer properties, drill hole machining instructions, etc.).

The design file can also include information associated with the outside shape of the PCB, the area contained within the PCB routed board outline, and/or a PCB side, which is a location to place components, typically the 'top' or 'bottom' of a PCB. This can also include mid-layers which are created as routed-out pockets where components can be placed on inner layers.

Data associated with the design file, either in a documentation file, as a native CAD file, as a manufacturing data file, or entered into a form by a user 102 can also include one or more customer PCBA specifications, such as a material of the PCB, a type of surface finish for the PCB, a solder mask color used to manufacture the PCB, a silkscreen color used to manufacture the PCB, a thickness associated with the conductive material of an inner layer of the PCB, a thickness associated with the conductive material of an outer layer of the PCB, a controlled impedance associated with the PCB, a final thickness of the PCB, a customer-approved solder flux type and associated method to clean the PCBA, a quantity of PCBAs needed, and/or a zip code associated with delivery of the finished PCBA to the user 102.

A manufacturing data file can refer to a digital representation of instructions or other information used during a manufacturing process (e.g. tool path information, image data for imaging processes, etc). A manufacturing data file can be used in fabrication, in assembly, or in both. A manufacturing data file may be derived from a design file using a CAD tool. A manufacturing data file may also be created without reference to a design file.

A BOM file can include a list of components to be installed on the PCB and information associated with the list of components. The BOM can also include a list of materials, off-the-shelf components, custom components, consumable materials, fasteners, or other parts needed to create a PCBA. For example, the information associated with each component can include a part designator used in the design file, a description of a component, a quantity of the component, a Manufacturer Part Number (MPN), and a manufacturer name. In some embodiments, the BOM file can be extracted from the design file.

Client device 104 is configured to send one or more input files via network 110 to PCBA manufacturer platform 130. In some embodiments, client device 104 is configured to upload the one or more files via a website or an application associated with the PCBA manufacturer. Examples of client system 104 include a computer, a laptop, a desktop, a tablet, a mobile device, a Personal Digital Assistant (PDA), or any other device that operates a web browser or client application.

Network 110 comprises one or more of the following: a local area network, a wide area network, a wireless network, the Internet, an intranet, or any other appropriate communication network.

Component database 120 includes a list of components provided by one or more component providers 140 and information associated with each of the components. For example, the information associated with each of the components can include an available quantity, prices for a single component and different component quantities (e.g., $X for 1 component, $Y for 10 components, etc.), an equivalent component made by a different manufacturer, and electrical properties of the component allowing discovery of an electrically equivalent component made by a different manufacturer. The list of components provided by one or more component providers 140 and information associated with each of the components can be updated periodically (e.g., hourly, daily, weekly, etc.), in real-time, and/or in response to receiving an updated list from one of the one or more component providers 140.

PCBA manufacturer platform 130 is configured to receive one or more files from client device 104 via network 110. One or more spatial features can be extracted from the one or more received files. For example, the one or more spatial features associated with the PCB can include a bounding height of the PCB (e.g., the height of the bounding box of a PCB), a bounding width of the PCB (e.g., the width of the bounding box of a PCB), a thickness of the PCB (e.g., the overall thickness of the combined physical layers of a PCB), a bounding area of the PCB (e.g., the PCB bounding width times the PCB bounding height), a conductive layer count, a minimum trace width, a minimum trace space, a surface-mount technology (SMT) placement count, a through-hole technology (THT) placement count, a leadless placement count, a mixed mounting technology placement count, a unique placement count, a THT pin count, a minimum finished hole size (FHS), a maximum FHS, a number of holes, a number of drills, a hole density, a via description, a standard via description, a via in pad count, a top via near pad count, a bottom via near pad count, a minimum pad dimension, a minimum pin pitch, and/or a count of PCB sides with SMT placements.

PCBA manufacturer platform 130 is configured to access component database 120. Component database 120 may be part of PCBA manufacturer platform 130 or coupled to PCB manufacturer platform 130 via a network 110. In some embodiments, PCBA manufacturer platform 130 can query one or more component providers 140 for component availability instead of querying component database 120. PCBA manufacturer platform 130 may be implemented using one or more computing devices, such as a computer, a multi-processor system, a microprocessor-based system, a special purpose device, a distributed computing environment including any of the foregoing systems or devices, or other appropriate hardware/software/firmware combination that includes one or more processors and memory coupled to processors and configured to provide the processors with instructions.

One or more component providers 140 is configured to receive from PCBA manufacturer platform 130 an order for one or more components associated with a PCBA design. Component provider 140 may be implemented using one or more computing devices, such as a computer, a multi-processor system, a microprocessor-based system, a special purpose device, a distributed computing environment including any of the foregoing systems or devices, or other appropriate hardware/software/firmware combination that includes one or more processors and memory coupled to processors and configured to provide the processors with instructions.

Figure 2A:
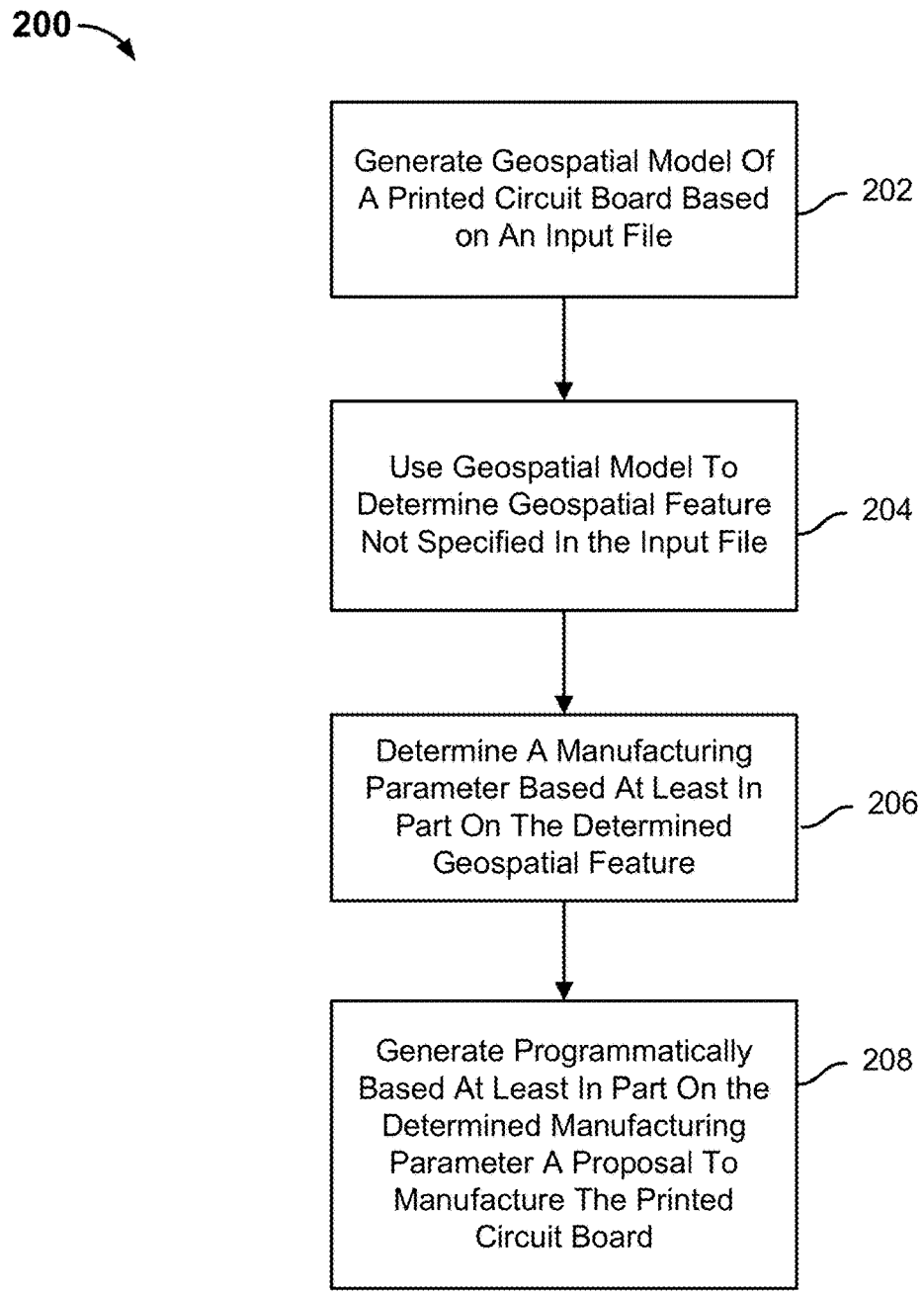
FIG. 2A is an example of a process for generating a proposal to manufacture a PCBA

FIG. 2A is an example of a process for generating a proposal to manufacture a PCBA. In some embodiments, process 200 can be implemented on a PCBA manufacturer platform, such as PCBA manufacturer platform 130.

At 202, a spatial model of a PCBA is generated based on one or more input files, which comprise some combination of one or more design files, one or more manufacturing data files, and one or more BOMs. A spatial model can be a data representation of a PCBA design for PCB and PCBA manufacture and quoting. The spatial model can include data describing logical layers, physical layers, tabular data, and/or key-value pairs. In some embodiments, the manufacturing data file is a Gerber file. In other embodiments, the design file is a native Computer Aided Design (CAD) file such as an Altium pcbdoc file, or any other CAD file.

At 204, the spatial model is used to determine a spatial feature not specified in the design file or manufacturing data file. For example, a minimum hole size, a minimum trace width (e.g., smallest distance across a conductor on a conductive physical layer), minimum trace spacing (e.g., smallest distance between two unconnected conductors on a conductive layer), a minimum spacing between components (e.g., smallest distance between any two components mounted on a PCBA, the existence of blind or buried vias, the existence of via in pads, particular drill features, and/or particular slot features can be determined from the spatial model.

At 206, a manufacturing parameter is determined based at least in part on the determined spatial feature. For example, a manufacturing parameter influencing a cost and/or time to manufacture the PCBA can be determined. In some embodiments, a minimum hole size, a minimum trace width, minimum trace spacing, a minimum spacing between components, the existence of blind or buried vias, the existence of via in pads, particular drill features, and/or particular slot features can be a manufacturing parameter.

At 208, a proposal to manufacture the PCBA is generated programmatically based at least in part on the determined manufacturing parameter. For example, the proposal can include a cost and/or time to manufacture the PCBA.

Figure 2B:
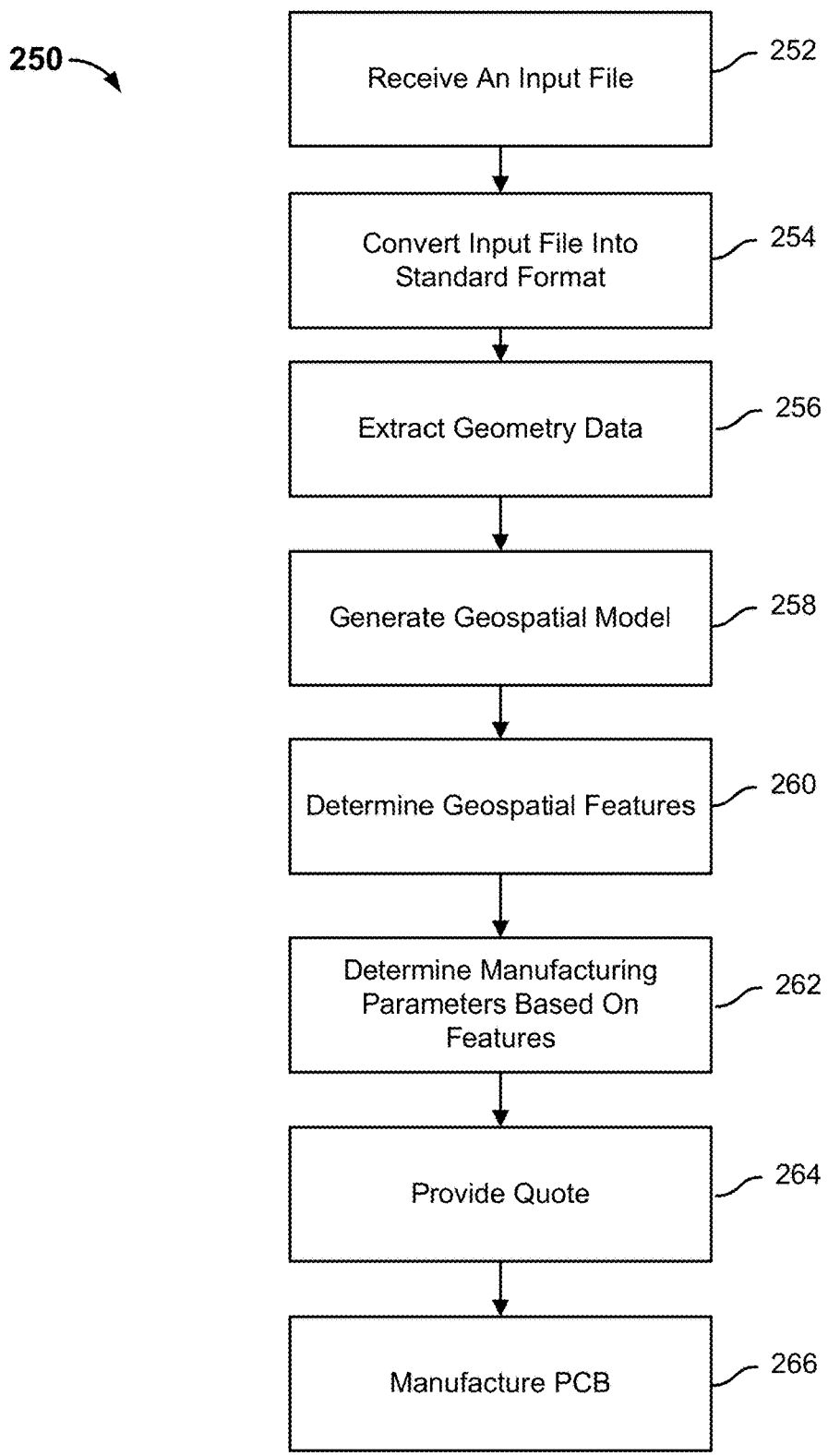
FIG. 2B is an example of a process for providing an estimate to manufacture a PCBA according to some embodiments.

FIG. 2B is an example of a process for providing a quote to manufacture a PCBA according to some embodiments. In some embodiments, process 250 can be implemented on a PCBA manufacturer platform, such as PCBA manufacturer platform 130.

At 252, an input file is received. The input file can be a design file (e.g., CAD file), a manufacturing data file, a bill of materials (BOM) file, and/or other information associated with designing a PCBA In some embodiments, the manufacturing data file is a Gerber file. In other embodiments, the design file is a native Computer Aided Design (CAD) file such as an Altium pcbdoc file, or any other CAD file.

At 254, the input file can be converted into a standard digital format. For example, an Altium .pcbdoc file can be converted into ODB++ or IPC-2581 format using a function of the Altium PCBA design software. A standard format helps normalize vendor specific variations of PCBA information. Other standard formats include GenCAD, RS-274X, and Gerber X2. In some embodiments, the standard format includes enumerations of PCB design primitives including line segments, position and dimension of drilled holes, position and dimension of finished holes, polygon outlines of silkscreen artwork. In some embodiments, step 254 is optional.

At 256, the PCBA design data is extracted from the design or converted file. The PCBA design can be represented as a plurality of points, lines, arcs, rectangles, circles, ovals, polygons, logical layers, property name-value pairs, and design meta-data. The plurality of data can be stored in memory or serialized to a file. This file format can be stored in one or more of several formats. Suitable file formats include, but are not limited to, JavaScript Object Notation (JSON), Extensible Markup Language (XML), or an SQLite file format.

At 258, a spatial model of the PCBA board to be manufactured is generated. The spatial model is comprised of the data extracted at 256. In some embodiments, the spatial model is loaded into an efficient data structure for computational geometry calculations. This data structure is used by computational geometry algorithms to efficiently find nearest neighbors, find if a point is inside a polygon, find the distance between two polygons, and other geometry calculations. Computational geometry software packages include, but are not limited to, The Computational Geometry Algorithms Library, Java Topology Suite, Geometry Engine Open Source, and Triangle. These packages use internal data structures that are loaded with programmatic calls to an application programming interfaces (API), or the internal data structures can be loaded from an input file format that is specified by the package. Within the computational geometry software, the data structures are typically, but not limited to, tree data structures such as Binary Space Partitioning (BSP) or R-tree. A tree data structure groups nearby objects and represents them within their minimum bounding rectangle. The computational geometry software package uses these rectangles to increase the efficiency of geometric algorithms. Instead of comparing each polygon to all the other polygons of the PCBA design, the tree data structure reduces the amount of computation time because the number of computations is reduced.

The spatial model includes coordinates for the location and orientation of each component. The spatial model includes the board outline logical layer, from which the PCB bounding length, PCB bounding width, and PCB bounding area can be efficiently calculated.

In some embodiments, the computational geometry calculations enable the PCBA manufacturer platform to determine whether two polygons of the spatial model are overlapping. For example, the computational geometry calculations enable the PCBA manufacturer platform to determine whether a via or a hole on a first logical layer overlaps with a pad on a second logical layer. A PCB design with a via hole that intersects with a pad can increase a cost and/or time to manufacture the PCB.

In some embodiments, the computational geometry calculations enable the PCBA manufacturer platform to determine a minimum spacing between all of the polygons of the spatial model. In some embodiments, a curved polygon is segmented and a linear approximation is performed to determine a distance between a straight-line polygon segment and a curved polygon line segment. A PCB design with minimum spacing less than a specified threshold can increase a cost and/or time to manufacture the PCB.

In some embodiments, the computational geometry calculations enable the PCBA manufacturer platform to determine a minimum width of, and/or a minimum spacing between a set of polygons and/or line segments that represent conductive traces. A PCB design with minimum trace width and/or spacing less than specified thresholds can increase a cost and/or time to manufacture the PCB.

In other embodiments, the computational geometry calculations enable the PCBA manufacturer platform to determine a minimum hole size for the PCB design. A PCB design with a minimum hole size less than a specified threshold can increase a cost and/or time to manufacture the PCB.

At 260, one or more spatial features of the spatial model are determined based on the extracted geometry data. For example, a minimum hole size, a minimum trace width, a minimum trace spacing, a minimum spacing between components, the existence of blind or buried vias, the existence of via in pads, particular drill features, and/or particular slot features can be determined from the extracted geometry data. Such spatial features are not explicitly provided in the design file.

At 262, one or more manufacturing parameters influencing a cost and/or time to manufacture the PCBA are determined based on the determined spatial features. The one or more manufacturing parameters influencing a cost and/or time to manufacture the PCBA depends on the determined spatial features of the PCBA design. For example, the minimum trace spacing can be a manufacturing parameter influencing a cost and/or time to manufacture the PCBA in some PCBA designs, but in other designs, the minimum trace width is not a manufacturing parameter influencing a cost and/or time to manufacture the PCBA. In some embodiments, a single manufacturing parameter depends on more than one spatial features. For example, a via treatment might be required to ensure consistent quality of solder joints manufactured during PCBA and are determined from the minimum hole diameter feature and the via-pad-overlap feature.

At 264, a quote of a cost and/or time to manufacture the PCBA is provided. In some embodiments, the quote is based in part on one or more manufacturing parameters, one or more component parameters, and/or one or more shipping parameters. For example, the one or more component parameters can include a price associated with each component to be installed on the PCBA and/or an availability of one or more components to be installed on the PCBA. The one or more shipping parameters can include a shipping method and a zip code associated with a destination of the manufactured PCBA.

At 266, the PCBA is manufactured based on the PCBA design. The PCBA can include the PCB and parts may be specified in a BOM.

Figure 3:
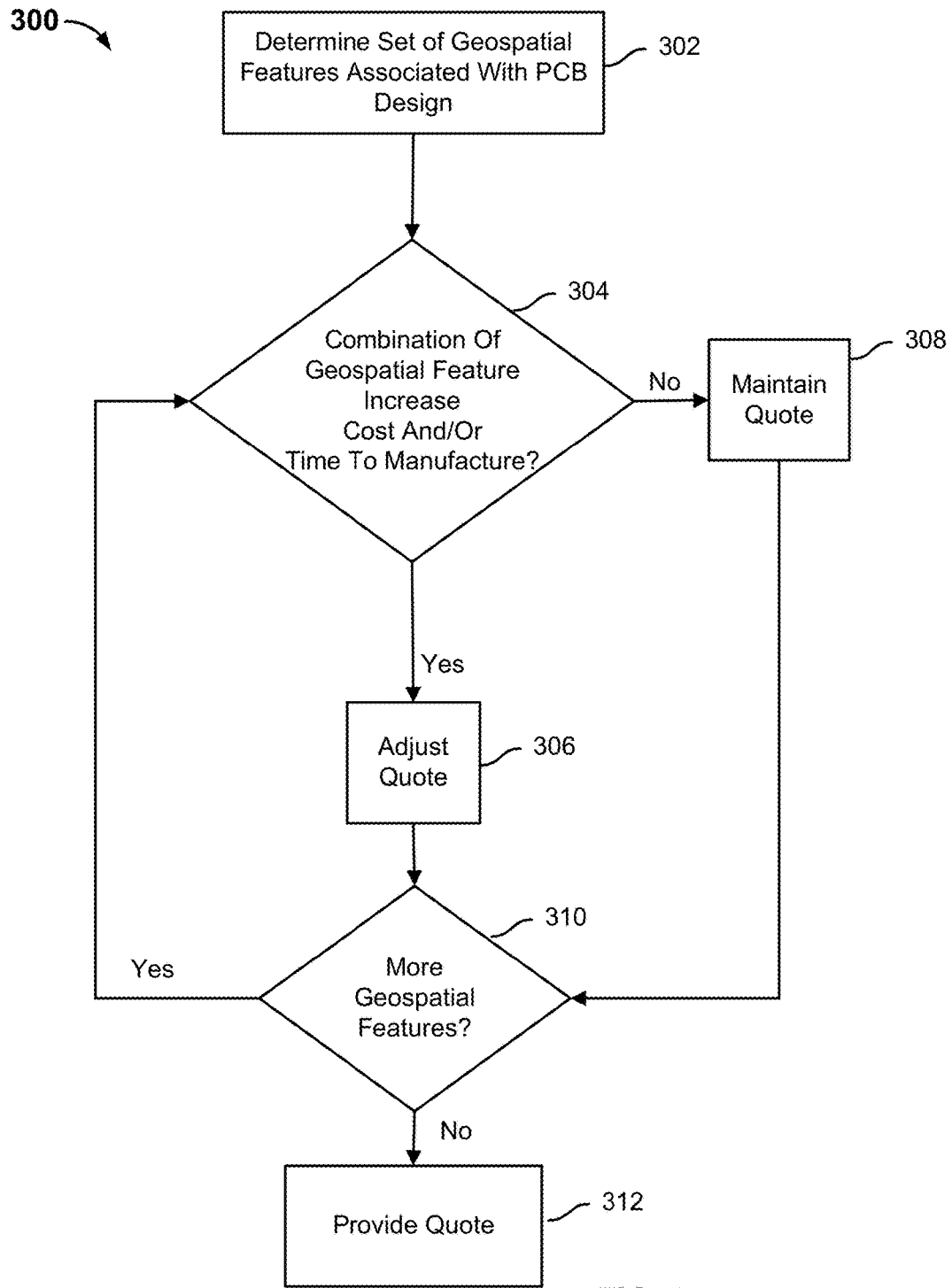
FIG. 3 is an example of a process for adjusting a quote of cost and/or time to manufacture a PCBA according to some embodiments.

FIG. 3 is an example of a process for adjusting a quote of cost and/or time to manufacture a PCBA according to some embodiments. In some embodiments, process 400 can be implemented on a PCBA manufacturer platform, such as PCBA manufacturer platform 130.

At 302, a set of one or more spatial features extracted from a PCBA design are determined. For example, the set of one or more spatial features include a height of the PCB, a width of the PCB, a thickness of the PCB, an area of the PCB, a conductive layer count, a minimum trace width, a minimum trace spacing, a Surface-Mount Technology (SMT) placement count, a through-hole technology (THT) placement count, a leadless placement count, a mixed technology placement count, a unique placement count, a total placement count, a THT pin count, a minimum finished hole size (FHS), a maximum FHS, a number of holes, a number of drills, a hole density, a via description, a standard via description, a via in pad count, a top via near pad count, a bottom via near pad count, a minimum pad dimension, and/or a count of PCB sides with SMT placements.

At 304, it is determined whether a combination spatial features in the set increases a cost and/or time to manufacture the PCBA. For example, a PCBA design that includes a conductive fill as treatment for via-in-pad can add three days to the time to manufacture. The PCBA design can also include a finished hole size that is smaller than four mil. Such a finished hole size, by itself, would add an extra day to the time to manufacture, but since the PCBA design includes a conductive fill as treatment for via-in-pad, the combination of spatial features will add three days to the time to manufacture. In some embodiments, the increase in the time to manufacture is controlled by the feature that adds the maximum number of days to the time to manufacture.

In some embodiments, a spatial feature causes the cost to manufacture the PCBA to increase, but this spatial feature does not cause the time to manufacture the PCBA to increase. In other embodiments, a spatial feature causes the time to manufacture the PCBA to increase, but this spatial feature does not cause the cost to manufacture to increase. In other embodiments, a spatial feature causes the time and the cost to manufacture the PCBA to increase.

In some embodiments, a minimum hole size of all the holes in the PCB design can cause the cost and/or time to manufacture the PCB to increase. Hole size refers to the size of a hole for a pin of a component, a hole for a via, or hole for a different purpose such as a mounting screw. For example, a PCB design with a minimum hole size greater than or equal to a first hole size threshold (e.g., 0.01 inches) will not cause the cost and/or time to manufacture the PCB to increase. However, a PCB design with a minimum hole size less than or equal to the first hole size threshold will cause the cost and/or time to manufacture the PCB to increase. In some embodiments, one or more additional thresholds that are smaller than the first hole size threshold can be used to delineate different increases to cost and/or time.

For example, a minimum hole size less than the first hole size threshold, but greater than or equal to a second hole size threshold can cause the cost and/or time to manufacture the PCB to increase by a first amount (e.g., percentage, price, additional days). A minimum hole size less than the second hole size threshold, but greater than or equal to a third hole size threshold can cause the cost and/or time to manufacture the PCB to increase by a second amount.

In some embodiments, a minimum trace width of the narrowest traces in the PCB design can cause the cost and/or time to manufacture the PCB to increase. Minimum trace width refers to the smallest width of any conductive trace in the PCB design. For example, a PCB design with a minimum trace width greater than or equal a first trace width threshold (e.g., 0.006 inches) will not cause the cost and/or time to manufacture the PCB to increase. However, a PCB design with a minimum trace width less than the first trace width threshold will cause the cost and/or time to manufacture the PCB to increase. In some embodiments, one or more additional thresholds that are smaller than the first trace width threshold can be used to delineate different increases to cost and/or time.

In some embodiments, a minimum trace spacing (smallest distance) between two unconnected conductors on a conductive layer can cause the cost and/or time to manufacture the PCBA to increase. For example, a PCBA design with a minimum trace spacing greater than or equal to a first trace spacing threshold (e.g., 0.006 inches) will not cause the cost and/or time to manufacture the PCBA to increase. However, a PCBA design with a minimum trace spacing less than the first trace spacing threshold will cause the cost and/or time to manufacture the PCBA to increase. In some embodiments, one more additional thresholds that are smaller than the first trace spacing threshold can be used to delineate different increases to cost and/or time.

In some embodiments, a minimum spacing between components in the PCBA design can cause the cost and/or time to manufacture the PCBA to increase. When components are installed on the PCB, there is a certain distance between the components. Minimum component spacing refers to the smallest distance between any two components in the PCBA design. For example, a PCBA design with a minimum component spacing greater than or equal to a first spacing threshold (e.g., 0.015 inches) will not cause the cost and/or time to manufacture the PCBA to increase. However, a PCBA design with a minimum component spacing less than the first spacing threshold will cause the cost and/or time to manufacture the PCBA to increase. In some embodiments, one or more additional thresholds that are smaller than the first spacing threshold can be used to delineate different increases to cost and/or time.

In some embodiments, the existence of blind and/or buried vias in a PCB design can cause the cost and/or time to manufacture the PCB to increase. Vias are used to connect between conductive layers of a PCB. A blind via connects an outer conductive layer to one or more inner conductive layers, but does not go through the entire board. A buried via connects two or more inner conductive layers, but does not go through an outer conductive layer. The existence of blind and/or buried vias can cause the cost and/or time to manufacture the PCB to increase. In some embodiments, the amount of increase can be based on the number of blind and/or buried vias. In other embodiments, the amount of increase can be based on the complexity of the blind and/or buried vias.

In some embodiments, the existence of a via in one or more pads in a PCB design can cause the cost and/or time to manufacture the PCB to increase. In other embodiments, various methods of filling a via (e.g., soldermask plug, non-conductive epoxy fill, conductive fill, other types, etc.) can cause the cost and/or time to manufacture the PCB to increase by different amounts.

In some embodiments, certain drill features can cause the cost and/or time to manufacture the PCB to increase. For example, the existence of a countersunk and/or counterbored holes can cause the cost and/or time to manufacture the PCB to increase.

In some embodiments, certain slot features can cause the cost and/or time to manufacture the PCB to increase. For example, the existence of a beveled slot and/or a castellated/controlled depth milled slot can cause the cost and/or time to manufacture the PCB to increase.

In the event that a spatial feature increases a cost and/or time to manufacture, the process proceeds to 306. In the event that a spatial feature does not increase a cost and/or time to manufacture, the process proceeds to 308.

At 306, a quote of a cost and/or time to manufacture the PCBA is adjusted. The cost and/or time to manufacture the PCBA is adjusted based on the spatial feature.

At 308, the quote of a cost and/or time to manufacture the PCBA is maintained. In some embodiments, the spatial feature does not change the cost and/or time to manufacture the PCBA.

At 310, it is determined whether there are more spatial features in the set to consider. In the event there are more spatial features in the set to consider, then the process proceeds to 304. In the event there are no more spatial features in the set to consider, then the process proceeds to 312.

At 312, a quote of the cost and/or time to manufacture the PCBA is provided.

Figure 4:
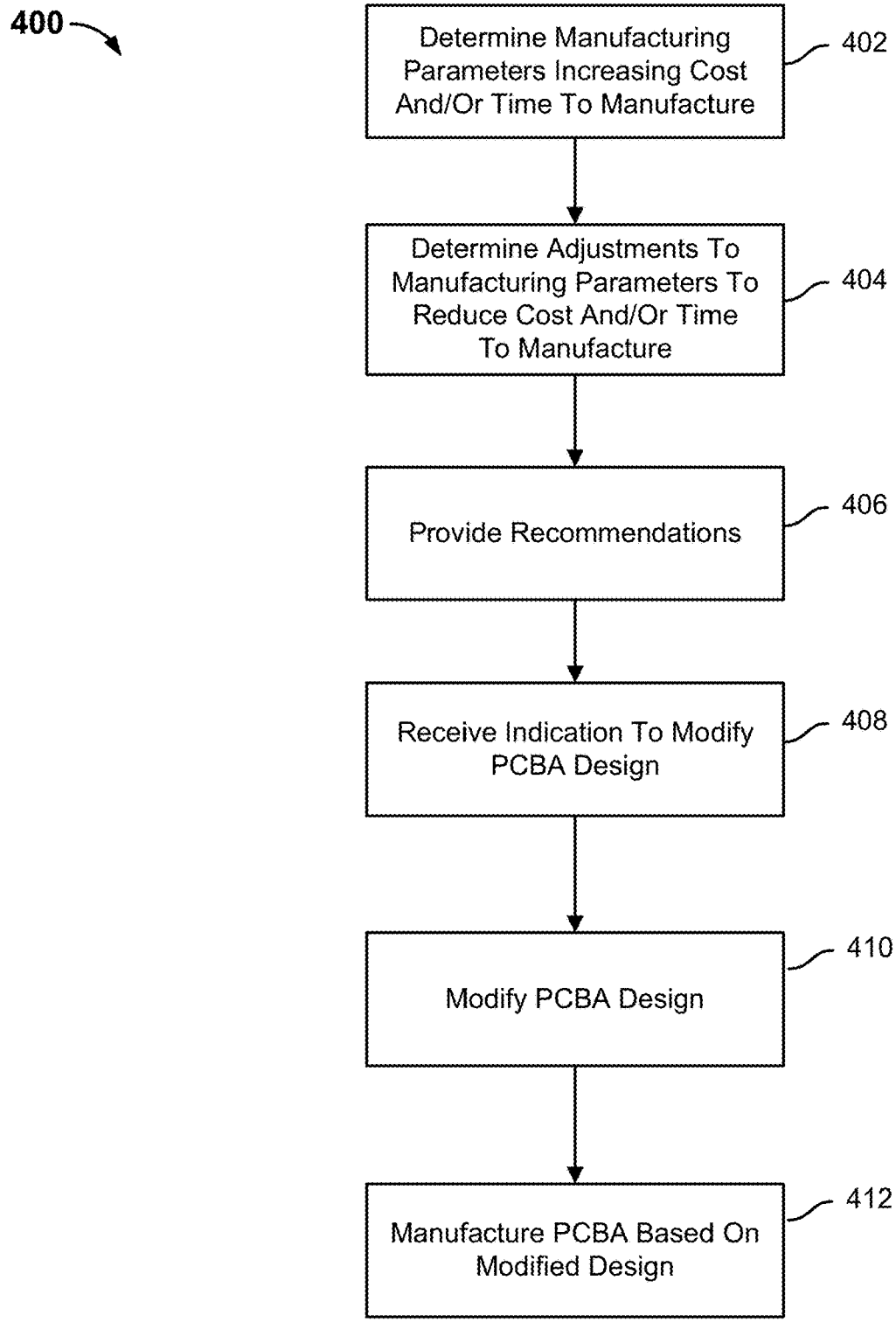
FIG. 4 is an example of a process for modifying a PCBA design according to some embodiments.

FIG. 4 is an example of a process for modifying a PCBA design according to some embodiments. In some embodiments, process 400 can be implemented on a PCBA manufacturer platform, such as PCBA manufacturer platform 130.

At 402, one or more manufacturing parameters that increase the cost and/or time to manufacture the PCBA are determined. The one or more manufacturing parameters can be extracted from an input file or specified by a user in an input file. For example, some of the manufacturing parameters, such as a quantity of PCBAs to be manufactured, a particular type of surface finish for the PCB, a material of the PCB (e.g., FR4), a particular solder mask color, a particular silk screen color, a controlled impedance, a controlled dielectric, and/or a board type (e.g., rigid, flex, rigid flex), can be specified by a user in an input file. Some of the manufacturing parameters, such as, size of circuit board, number of layers of PCB, the number of board conductive layers, a final thickness, a conductive material thickness of an inside conductive layer, a conductive material thickness of an outside conductive layer, a stackup, a particular hole size, a particular trace width, a particular trace spacing, a particular spacing between components on the PCB, blind or buried vias, vias in pads, drill features such as countersunk or counterbored holes, and/or slot features such as castellated or controlled depth milling, can be extracted from an input file.

In some embodiments, the one or more manufacturing parameters can be provided in a design file or in a file in addition to the design file.

In some embodiments, the PCBA design file can include manufacturing parameters that increase the cost and/or time to manufacture the PCBA and manufacturing parameters that do not increase the cost and/or time to manufacture the PCBA. The manufacturing parameters that increase the cost and/or time to manufacture the PCBA are identified. For example, a PCB design with a minimum hole size of 0.004 inches can increase the cost and/or time to manufacture while a PCB design with minimum hole size of 0.006 inches does not increase the cost and/or time to manufacture.

In some embodiments, the amount of cost and/or time to manufacture a PCBA is based on a specific range in which a manufacturing parameter is located. For example, a default range includes values above a first threshold that do not increase the cost and/or time to manufacture a PCBA. A first range that includes values equal to or less than the first threshold and greater than a second threshold can increase the cost and/or time to manufacture the PCBA by a first amount. A second range that includes values equal to or less than the second threshold and greater than a third threshold can increase the cost and/or time to manufacture the PCBA by a second amount.

In some embodiments, the cost to manufacture a PCBA is increased by a fixed amount or fixed percentage depending on the range in which the manufacturing parameter is located. In some embodiments, the amount of time to manufacture is increased by a fixed number of days depending on the range in which the manufacturing parameter is located. For example, a PCBA with a manufacturing parameter in the second range can increase the cost to manufacture the PCBA by 12% and/or add two extra days to manufacture.

At 404, one or more adjustments to the one or more manufacturing parameters that can reduce the cost and/or time to manufacture the PCBA are determined. For example, a PCB design can require one of the traces to have a width of 0.0025 inches. Such a trace width increases the amount of time and cost to manufacture the PCB because more precision is required in the PCB fabrication process to accurately produce a PCB with such a small feature size. The fabrication process is subject to error because a PCB can be over-etched or under-etched. This is possible if the PCB is submerged in a wet etch chemical solution for a duration (e.g., two minutes) that is either too long or too short. In some embodiments, the PCBA manufacturer platform is configured to recommend a different trace width to reduce the cost and/or time to manufacture the PCB. For example, a trace width of 0.006 inches can be recommended. Such a trace width can reduce the cost and/or time to manufacture the PCB because a PCB with such a trace width can be produced with higher yield and/or looser process tolerance. The margin for error is larger because the duration that causes over-etch of a PCB with such a trace width is longer than the duration that causes over-etch of a PCB with a trace width of 0.0025.

A pad is an exposed conductor surfaces to which components are connected with a solder joint during the PCBA process. A via is a plated hole that connects conductors on two or more conductive physical layers. Any overlap between a pad and a via can result in unexpected flow of solder during the PCBA process, resulting in faulty solder connections. In other embodiments, one or more vias near one or more pads can be identified and alternate locations for the one or more vias can be recommended.

At 406, a recommendation that includes the one or more adjustments is provided to a client device. In some embodiments, the recommendation includes an amount of cost and/or time reduced associated with each of the one or more adjustments.

At 408, an indication is received from the client device to modify the PCBA design according to at least one of the one or more recommended adjustments. At 410, the PCBA design is modified. The indication can indicate that PCBA design is too expensive to manufacture, one or more modifications to the PCBA design made by a user associated with the client device, an acknowledgement to allow a user associated with a PCBA manufacturing platform to modify the PCBA design, or an acknowledgement to allow a software module associated with the PCBA manufacturing platform to modify the PCBA design. At 412, one or more PCBAs are manufactured based on the modified design.

Figure 5:
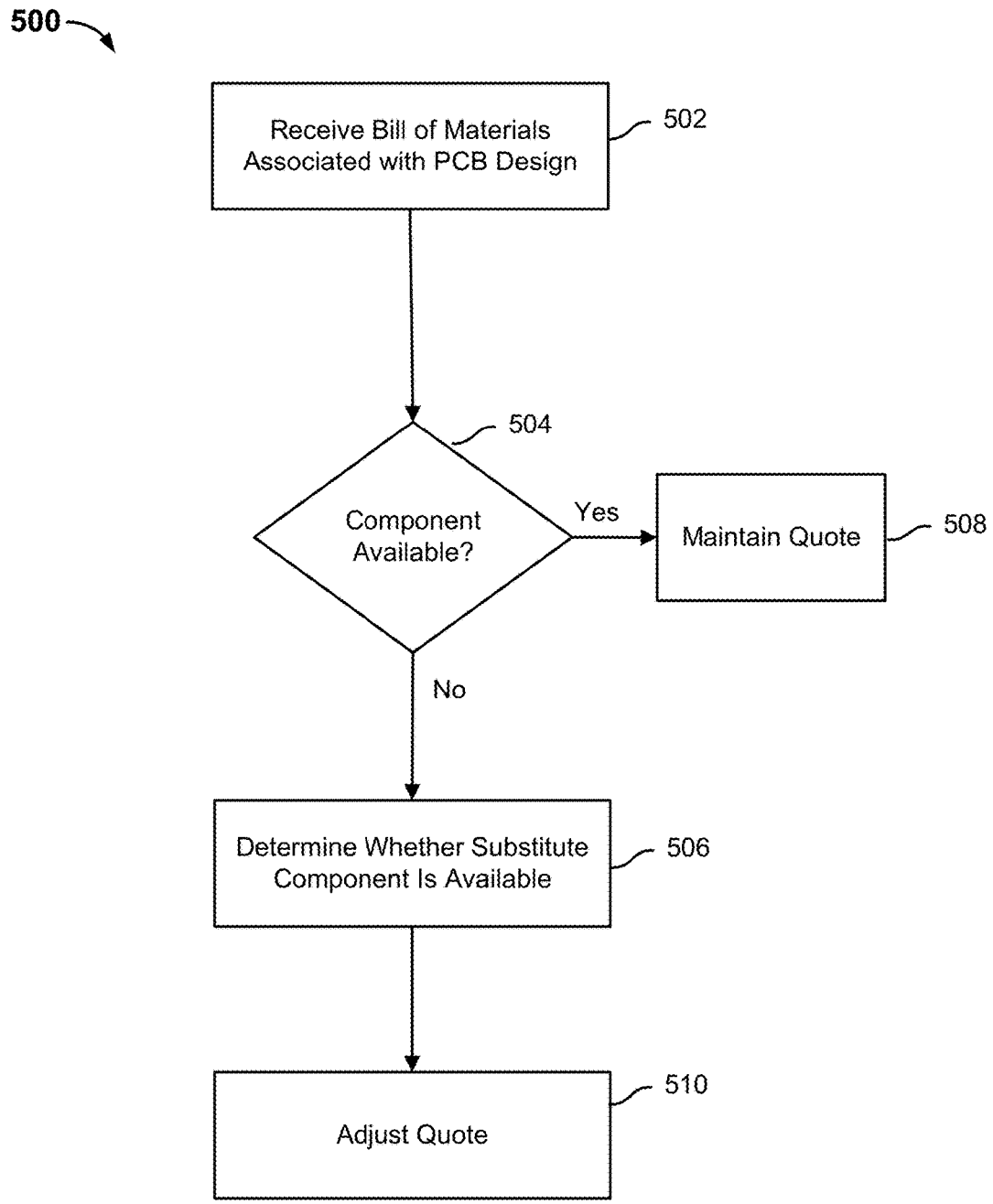
FIG. 5 is an example of a process for determining a component parameter of a quote for a PCBA design according to some embodiments.

FIG. 5 is an example of a process for determining a component parameter of a quote for a PCBA design according to some embodiments. In some embodiments, process 500 can be implemented on a PCBA manufacturer platform, such as PCBA manufacturer platform 130.

At 502, a BOM associated with a PCBA design is received. The BOM includes a list of components that are to be installed on the PCBA. In some embodiments, the BOM is received in a file format such as .csv or .xlsx format. In other embodiments, the BOM is derived from a design file, such as a CAD file. In some embodiments, the BOM can be uploaded to a website or other application associated with the PCBA manufacturer platform. In other embodiments, a client device sends the BOM to the PCBA manufacturer platform via email or other electronic communication methods.

In some embodiments, a list of components of the BOM is compared with one or more components of a design file. In the event a quantity of a component listed on the BOM does not match a quantity of the component in the design file, the PCBA manufacturer platform is configured to provide a client device with a notification of the mismatch. In the event a component is listed on the BOM, but the component is not part of the PCBA design file, the PCBA manufacturer platform is configured to provide the client device with a notification of the mismatch. In the event a component is listed on the BOM and the corresponding pads on the PCB are too small, too big, the wrong shape, and/or the wrong number, the PCBA manufacturer platform is configured to provide the client device with a notification of the mismatch.

At 504, it is determined whether each component listed on the BOM is available. In some embodiments, a component listed on the BOM is available if the number of components needed for a single PCBA×the number of boards+attrition (e.g., component and/or manufacturing defects)≤the available quantity of the component at the component database. In other embodiments, a component listed on the BOM is available if the number of components needed for a single PCBA×the number of boards≤the available quantity of the component at the component database. In some embodiments, a component database with up-to-date component information can be queried to see if a component and an associated number of components is available. The component database can provide an availability for each component listed on the BOM. This reduces the amount of time to manufacture the PCBA because manually determining whether one or more part providers have the necessary inventory to meet the requirements of a PCBA design can take hours, even days, to complete. In the event a component is available, the process proceeds to 508. In the event a component is not available, the process proceeds to 506.

At 506, it is determined whether a substitute component is available. A substitute component can be determined based on a part number associated with a component on the BOM. For example, a parts provider may provide the component database with information that indicates Part A of Provider X is equivalent electrically (same electrical behavior), physically (same physical dimensions and surface finish), and materially (same properties such as lead-free) to Part B of Provider Y. In some embodiments, a substitute component is available if the number of substitute components needed for a single PCBA×the number of boards+attrition (e.g., component and/or manufacturing defects)≤the available quantity of the substitute component at the component database. In other embodiments, a substitute component is available if the number of substitute components needed for a single PCBA×the number of boards≤the available quantity of the substitute component at the component database. In other embodiments, a substitute component is available, if an available quantity of the component+available quantity of substitute component≥the number of components needed for a single PCBA×the number of boards+attrition (e.g., component and/or manufacturing defects).

At 508, the quote that includes a cost and/or time to manufacture the PCBA is maintained. For example, a BOM includes a list of components each with an associated price and expected delivery time. An initial quote can be created based on such information.

At 510, the quote of a cost and/or time to manufacture the PCBA is adjusted based on whether the substitute component is available. In the event a substitute component is not available and/or the client elects to not assemble or to consign this component, the cost of the initial quote is reduced by an amount associated with the component not being available, i.e., the cost of the component times the number of its requested placements. In the event a substitute component is available, the cost of the initial quote is adjusted based on an amount associated with the substitute component, i.e., the difference between the cost of the substitute component and the cost of the original component, times the number of its requested placements. In other embodiments, the time to manufacture the PCBA is adjusted based on any additional days needed for the PCBA manufacturer to receive the substitute component.

In some embodiments, a component is available, but not at the quantity requested on the BOM. The PCBA manufacturer platform is configured to provide a client device an option to order the available quantity and a notification of a deficient quantity that is unable to be fulfilled.

In some embodiments, a substitute component is available, but not at the quantity requested on the BOM. The PCBA manufacturer platform is configured to provide a client device an option to order the available quantity and a notification of a deficient quantity that is unable to be fulfilled.

Figure 6:
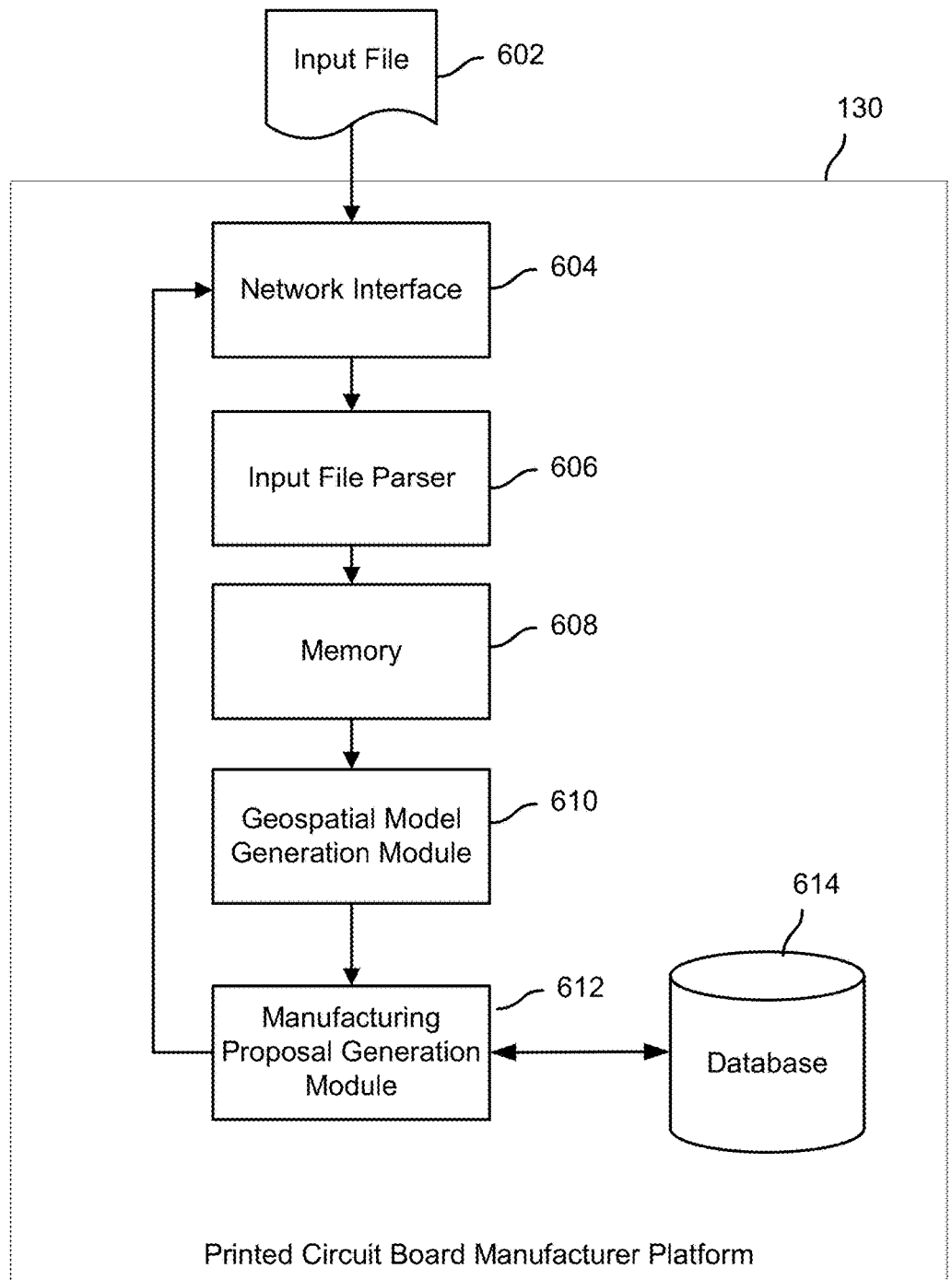
FIG. 6 is a block diagram illustrating an embodiment of a PCBA manufacturer platform.

FIG. 6 is a block diagram illustrating an embodiment of a PCBA manufacturer platform. In the example shown, PCBA manufacturer platform 130 of FIG. 1 is shown to receive an input file 602, such as a design file or manufacturing data file, via a network interface 604. Network interface 604 may comprise a network interface card. Network interface 604 passes the input file 602 to an input file parser 606. In various embodiments, input file parser 606 includes, implements, and/or embodies one or more of an SDK, an API, or other software code and/or interfaces of an original equipment manufacturer (OEM) or vendor with which the input file 602 is associated. In some embodiments, parser 606 extracts data from the input file 602 and creates a standards-based representation of the design at least in part in the form of a proprietary implementation of the standards-based representation in which additional information than that strictly required by the standard is included. The parser 606 generates and stores in a memory 608 a representation of the design embodied in input file 602. Geospatial model generation module 610, which may be a software module provided by operation of a processor-executed associated computer code stored in memory, extracts one or more spatial features of the design embodied in input file 602. In some embodiments, the extracted features may be represented and stored in memory in the form of a feature vector or other data structure. A manufacturing proposal generation module 612 uses the spatial module to determine one or more manufacturing parameters, as disclosed herein, such as shortest distance between traces, minimum trace width, board thickness, etc., and uses information stored in a database 616 to map the one or more manufacturing parameters to corresponding impacts (e.g., additional or reduced cost, additional or reduced time), dependencies, etc. Manufacturing proposal generation module 614 takes such manufacturing parameters into consideration in generating programmatically a manufacturing proposal to manufacture a specified number of PCBA's (e.g., a number requested by a party that submitted design file 602). The proposal is sent via network interface 604 to a destination with which design file 602 is associated.

Using techniques disclosed herein, more accurate manufacturing proposals, such as quotes, may be provided based on a PCBA design file, with greater fidelity than in a traditional approach, typically in real time (e.g, seconds, minutes).

Although the foregoing embodiments have been described in some detail for purposes of clarity of understanding, the invention is not limited to the details provided.

There are many alternative ways of implementing the invention. The disclosed embodiments are illustrative and not restrictive.

What is claimed is:

1. A system, comprising:
a processor configured to:
generate a spatial model of a printed circuit board assembly based on at least one input file;
use the spatial model to determine one or more spatial features not specified directly in the at least one input file;
determine one or more manufacturing parameters based at least in part on the determined one or more spatial features not specified directly in the at least one input file;
determine which of the one or more manufacturing parameters influence a proposal to manufacture the printed circuit board assembly, wherein the proposal includes a cost and/or time to manufacture the printed circuit board assembly;
generate programmatically, based at least in part on the determined one or more manufacturing parameters, the proposal to manufacture the printed circuit board assembly;
identify one or more manufacturing parameters that can be modified, wherein the one or more identified manufacturing parameters include one or more corresponding adjustments to the one or more of the identified manufacturing parameters, wherein the one or more corresponding adjustments will result in an improvement to the proposal to manufacture the printed circuit board assembly; and
specify to a client device one or more of the identified manufacturing parameters; and
a memory coupled to the processor and configured to provide the processor with instructions.

2. The system of claim 1, wherein the at least one input file is a design file, a manufacturing data file, or a Bill of Materials (BOM).

3. The system of claim 1, wherein the processor is further configured to control manufacture of the printed circuit board assembly according to the determined one or more manufacturing parameters.

4. The system of claim 1, wherein the at least one input file is a Bill of Materials (BOM) and a design file, wherein the processor is further configured to determine a mismatch between at least one component of the BOM and at least one component of the design file.

5. The system of claim 1, wherein the processor is further configured to convert the input file into a standard format.

6. The system of claim 1, wherein the one or more spatial features not specified directly in the input file are not represented by a text field of the input file.

7. The system of claim 1, wherein the one or more spatial features are determined using a computational geometry data structure.

8. The system of claim 1, wherein the processor is further configured to receive from the client device an indication to modify a design of the printed circuit board assembly.

9. The system of claim 8, wherein the processor is further configured to modify the design of the printed circuit board assembly based on the indication.

10. The system of claim 1, wherein the processor is further configured to identify one or more manufacturing parameters that can be modified that will result in an improvement to the proposal to manufacture the printed circuit board.

11. The system of claim 10, wherein the improvement comprises a reduction of the overall time to manufacture the printed circuit board assembly.

12. The system of claim 10, wherein the improvement comprises a reduction to the overall cost to manufacture the printed circuit board assembly.

13. The system of claim 1, wherein to generate the spatial model, the processor is configured to extract geometry data from the at least one input file.

14. The system of claim 1, wherein the spatial model is generated by combining data from multiple input files comprising a combination of one or more design files, one or more manufacturing data files, and/or one or more BOMs.

15. A method, comprising:
generating a spatial model of a printed circuit board assembly based on at least one input file;
using the spatial model to determine one or more spatial features not specified directly in the at least one input file;
determining one or more manufacturing parameters based at least in part on the determined one or more spatial features not specified directly in the at least one input file;
determining which of the one or more manufacturing parameters influence a proposal to manufacture the printed circuit board assembly, wherein the proposal includes a cost and/or time to manufacture the printed circuit board assembly;
generating programmatically based at least in part on the determined one or more proposal influencing manufacturing parameters the proposal to manufacture the printed circuit board assembly;
identifying one or more manufacturing parameters that can be modified, wherein the one or more identified manufacturing parameters include one or more corresponding adjustments to the one or more of the identified manufacturing parameters, wherein the one or more corresponding adjustments will result in an improvement to the proposal to manufacture the printed circuit board assembly; and
specifying to a client device one or more of the identified manufacturing parameters.

16. The method of claim 15, wherein generating the spatial model includes extracting geometry data from the at least one input file.

17. A computer program product, the computer program product being embodied in a tangible non-transitory computer readable storage medium and comprising computer instructions for:
generating a spatial model of a printed circuit board assembly based on at least one input file;
using the spatial model to determine one or more spatial features not specified directly in the at least one input file;
determining one or more manufacturing parameters based at least in part on the determined one or more spatial features not specified directly in the at least one input file;
determining which of the one or more manufacturing parameters influence a proposal to manufacture the printed circuit board assembly, wherein the proposal includes a cost and/or time to manufacture the printed circuit board assembly;
generating programmatically, based at least in part on the determined one or more proposal influencing manufacturing parameters, the proposal to manufacture the printed circuit board assembly;

identifying one or more manufacturing parameters that can be modified, wherein the one or more identified manufacturing parameters include one or more corresponding adjustments to the one or more of the identified manufacturing parameters, wherein the one or more corresponding adjustments will result in an improvement to the proposal to manufacture the printed circuit board assembly; and specifying to a client device one or more of the identified manufacturing parameters.

* * * * *